United States Patent [19]

Nozaki

[11] Patent Number: 4,739,502

[45] Date of Patent: Apr. 19, 1988

[54] CLOCK SIGNAL GENERATING CIRCUIT FOR DYNAMIC TYPE SEMICONDUCTOR MEMORY DEVICE

[75] Inventor: Shigeki Nozaki, Kuwana, Japan

[73] Assignee: Fujitsu Limited, Kanagawa, Japan

[21] Appl. No.: 894,148

[22] Filed: Aug. 7, 1986

[30] Foreign Application Priority Data

Aug. 14, 1985 [JP] Japan .................. 60-178963

[51] Int. Cl.$^4$ ............................. G11C 13/00
[52] U.S. Cl. ..................... 365/233; 365/154; 365/189
[58] Field of Search ............ 365/154, 189, 230, 182, 365/233

[56] References Cited

U.S. PATENT DOCUMENTS

4,562,555 12/1985 Ouchi et al. .................. 365/233

Primary Examiner—Terrell W. Fears
Attorney, Agent, or Firm—Armstrong, Nikaido, Marmelstein, Kubovcik

[57] ABSTRACT

A clock signal generating circuit for a dynamic type semiconductor memory device including an input voltage level control unit for converting a transistor-transistor-logic (TTL) drive level to a metal-oxide-semiconductor (MOS) drive level during transmission of an address strobe signal; an address buffer control unit for generating an address signal and an inverted address signal in response to a trailing edge of the address strobe signal, a clock signal generating unit for generating a clock signal used for a word line selection and an input signal for a next stage in response to a low level of the address strobe signal, and an inhibiting unit for inhibiting a drive of the word line by the clock signal when the address strobe signal is at high level in the timing of a leading edge of the clock signal.

6 Claims, 10 Drawing Sheets

CLOCK SIGNAL GENERATING CIRCUIT FOR DYNAMIC TYPE SEMICONDUCTOR MEMORY DEVICE

BACKGROUND OF THE INVENTION

1. Field of the Invention

The present invention relates to a clock signal generating circuit for a dynamic type semiconductor memory device having an improved means for preventing failures caused by noises transmitted through an address strobe signal.

2. Description of the Related Art

Recently, in the field of the semiconductor memory device, the greater the miniaturization and integration, the narrower a space between wiring patterns. In this narrow space, the operation of the memory device is apt to be affected by noises caused by crosstalk between wiring patterns, or by differences in threshold voltage levels between external circuits. Particularly, in the dynamic type random access memory (below, DRAM), when these noises interfere with an address strobe signal which controls the read/write operations of the DRAM, a level of the address strobe signal is changed from a high level to a low level.

Selection of the word lines is based on the low level of the address strobe signal, and in the above case, a potential of a selected word line usually becomes an intermediate level even though a sense amplifier has not been activated. Consequently, information previously stored in a memory cell of the DRAM, which is connected to the selected word line, is destroyed by this intermediate level of the word line and thus failures in the read/write operations occur in the DRAM.

These problems are explained in detail hereinafter.

SUMMARY OF THE INVENTION

The object of the present invention is to provide a clock signal generating circuit for a dynamic type semiconductor memory device having an improved means for preventing failures caused by noises transmitted through an address strobe signal.

In accordance with the present invention, there is provided a clock signal generating circuit for a dynamic type semiconductor memory device comprising: an input voltage level control unit for converting a transistor-transistor-logic (TTL) drive level to a metal-oxide-semiconductor (MOS) drive level during transmission of an address strobe signal $\phi_{IN}$; an address buffer control unit for generating an address signal ADD and an inverted address signal in response to a trailing edge of the address strobe signal; a clock signal generating unit for generating a clock signal $\phi_2$ used for a word line selection and an input signal for a next stage in response to a low level of the address strobe signal; and an inhibiting unit for inhibiting a drive of the word line by the clock signal when the address strobe signal is at a high level in the timing of a leading edge of the clock signal.

DESCRIPTION OF THE PREFERRED EMBODIMENTS

Before describing the preferred embodiments, an explanation will be given of a conventional clock signal generating circuit for a dynamic type semiconductor memory device.

Figure 1:
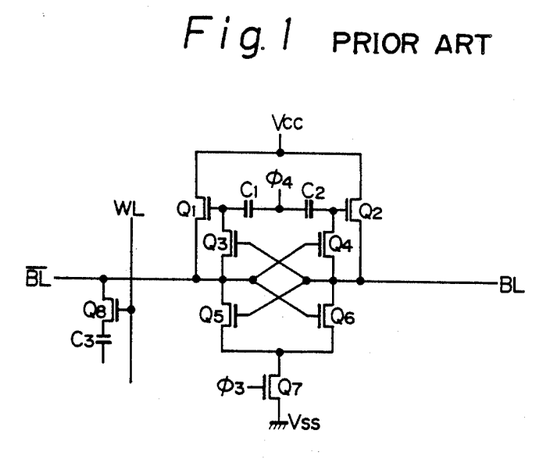
FIG. 1 is a circuit diagram of a conventional sense amplifier and a memory cell.

Referring to FIG. 1, WL denotes a word line, and $\overline{BL}$ and BL a pair of bit lines. A memory cell is constituted by a gate transistor $Q_8$ and a capacitor $C_3$, and a sense amplifier is constituted by transistors $Q_1$ to $Q_7$ and capacitors $C_1$ and $C_2$. Vcc denotes the first power source and Vss the second power source (usually ground potential). $\phi_3$ and $\phi_4$ denote clock signals for activating this circuit.

In a standby state, bit lines BL and $\overline{BL}$ are previously charged to, for example, Vcc/2 (volt). When the word line WL is selected and set to a high level, the transistor $Q_8$ is turned ON so that charges are migrated between the capacitor $C_3$ and the bit line $\overline{BL}$. In this case, if no charges exist in the capacitor $C_3$, the potential of the bit line $\overline{BL}$ is slightly lowered since charges are migrated from the bit line $\overline{BL}$ to the capacitor $C_3$. In this case, a potential difference between the bit line BL and $\overline{BL}$ occurs since the potential of the bit line $\overline{BL}$ does not change, and this potential difference is amplified by the sense amplifier.

Figure 2:
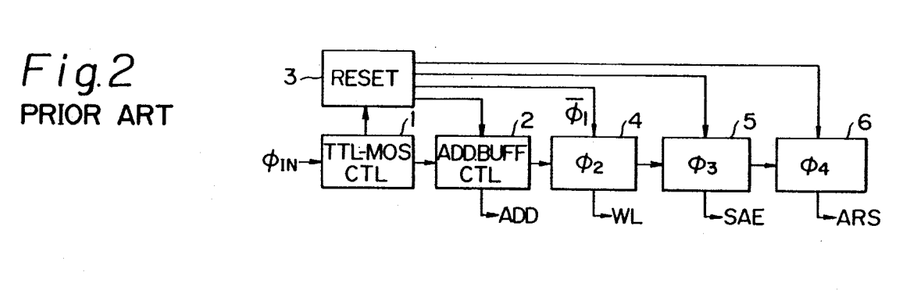
FIGS. 2 and 3 are schematic block diagrams of conventional clock signal generating circuits for a dynamic type semiconductor memory device.

Referring to FIG. 2, reference number 1 denotes an input voltage level control unit (TTL-MOS CTL) for converting a transistor-transistor-logic (TTL) drive level to a metal-oxide-semiconductor (MOS) drive level during transmission of the address strobe signal. Numeral 2 denotes an address buffer control unit (ADD-BUFF CTL) for generating the address signal ADD and the inverted address signal in response to a trailing edge of the address strobe signal; 3 denotes a first clock signal $\phi_1$ generating unit (RESET) for generating reset signals in response to the trailing edge of the address strobe signal; 4 denotes a second clock signal $\phi_2$ generating unit for generating a clock signal used for a word line selection and an input signal for a next stage in response to the low level of the address strobe signal; 5 denotes a third clock signal $\phi_3$ generating unit for generating a clock signal used as a sense amplifier enable signal SAE and the input signal for the next stage, and 6 denotes a fourth clock signal generating unit for generating a clock signal used as the active restore signal ARS. The signals $\phi_3$ and $\phi_4$ are input to the sense amplifier shown in FIG. 1, and the signal $\phi_{IN}$ denotes the address strobe signal.

Figure 3:
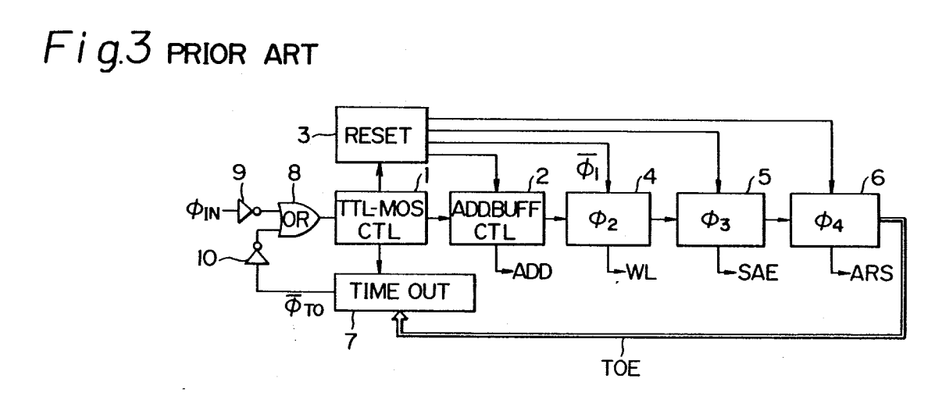

FIG. 3 shows another conventional clock signal generating circuit having conventional means for preventing failures caused by noises transmitted through the address strobe signal. In FIG. 3, reference number 7 denotes a time out unit for treating the high level of the address strobe signal as the low level of the address strobe signal during a predetermined period, 8 an OR gate, and 9 and 10 inverters. The signal T0E denotes a time out end signal fed back from the unit 6.

As is obvious from the drawing, these units 7 to 10 are added to the circuit shown in FIG. 2 as a means for preventing failures caused by noises.

The operation of these conventional circuits will be explained briefly with reference to FIGS. 4 to 7.

Figure 4:
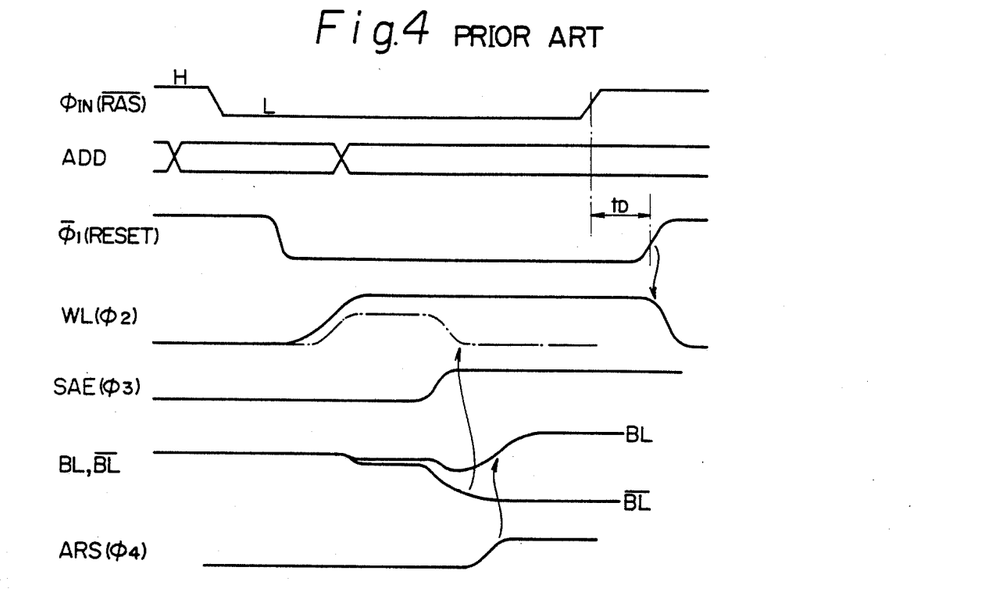
FIGS. 4 and 6 are timing charts showing clock signals.

Referring to FIG. 4, when the clock signal $\phi_{IN}$ as a row address strobe signal RAS becomes low (L) level, the address signal ADD (or the inverted address signal) is input to a word decoder (not shown). When the reset signal $\overline{\phi}_1$ becomes "L" level, the word line WL is selected by the clock signal $\phi_2$ and is set to a high (H) level. When the word line WL is "H" level, the transistor $Q_8$ is turned ON. A potential difference between bit lines BL and $\overline{BL}$ occurs because the transistor $Q_8$ is turned ON, and then this potential difference is amplified by the sense amplifier because the transistor $Q_7$ is turned ON by the clock signal $\phi_3$ as the signal SAE. In this case, since the bit line $\overline{BL}$ is "L" level and the bit line BL is "H" level, the transistor $Q_5$ of the sense amplifier is turned ON and the transistor $Q_6$ is turned OFF. Accordingly, the potential of the bit line $\overline{BL}$ is pulled down to the potential of the ground Vss. Next, the clock signal $\phi_4$ is input to the capacitors $C_1$ and $C_2$, and then an "active restore" is performed to the bit line BL. That is, when the bit line BL is "H" level and the bit line $\overline{BL}$ is "L" level, the transistor $Q_3$ is turned ON and the transistor $Q_4$ is turned OFF. Accordingly, when the clock signal $\phi_4$ is pulled up, the transistor $Q_2$ is completely turned ON by the "bootstrap effect", and then the potential of the bit line BL is pulled up to the potential of the power source Vcc. The bit line $\overline{BL}$ is not pulled up when the clock signal $\phi_4$ is "H" level, since when the transistor $Q_3$ is turned ON, the transistor $Q_1$ is turned OFF.

Figure 5:
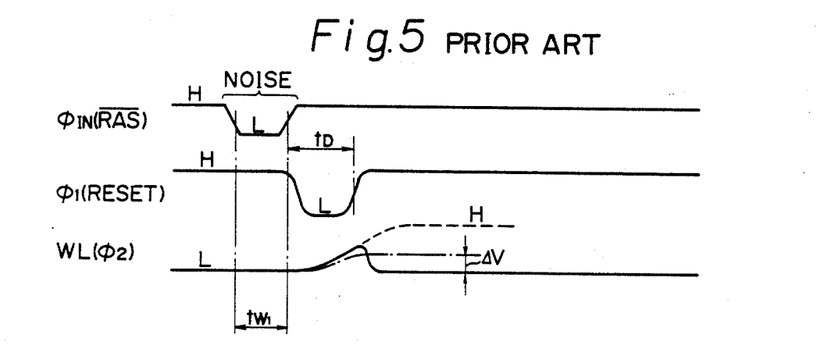
FIGS. 5 and 7 are waveforms showing clock signals affected by noises in an address strobe signal.

Referring to FIG. 5, the clock signal $\phi_{IN}$ as the row address strobe signal $\overline{RAS}$ temporarily becomes "L" level which is caused by noises, for example, crosstalk noise or noise caused by a difference in threshold level. The clock signal generating circuit shown in FIG. 2 is activated by this "L" level of the strobe signal $\phi_{IN}$. Since the operation of this circuit is completed after a delay time $t_D$ from the leading edge of the strobe signal $\phi_{IN}$, as shown by the reset signal $\overline{\phi}_1$, the word line WL becomes "H" level when the pulse width $t_{W1}$ of the noise is wide. When the potential of the word line WL exceeds the threshold level of the transistor $Q_8$, as shown by $\Delta V$, the transistor $Q_8$ is turned ON, and the capacitor $C_3$ is then charged or discharged. In this case, when the width of the noise $t_{W1}$ is narrow and the potential of the word line WL is insufficient to generate clock signals $\phi_3$ and $\phi_4$, these clock signals are not generated and thus the sense amplifier is not activated. Accordingly, the information previously stored in the memory cell is destroyed since the sense amplifier is not activated.

Figure 6:
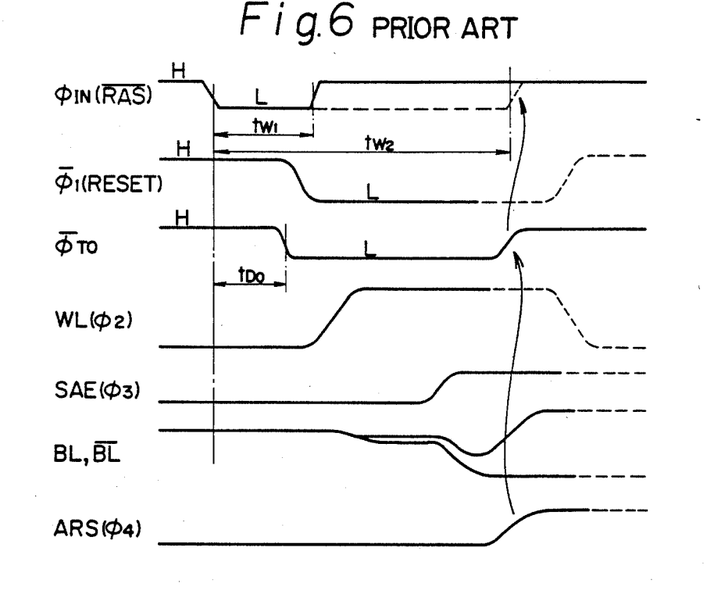

Referring to FIG. 6, the signal $\overline{\phi}_{TO}$ denotes an output signal of the time out unit 7 shown in FIG. 3. The time $T_{D0}$ is a delay time between a trailing edge of the signal $\phi_{IN}$ and a trailing edge of the signal $\phi_{TO}$. In this case, when "L" level period $t_{W1}$ of the $\phi_{IN}$ exceeds the period $t_{D0}$, this "L" level period $t_{W1}$ is treated as a period $t_{W2}$ shown by a dotted line (enlarged from the period $t_{W1}$). That is, when the clock signal $\phi_{IN}$ is input, the time out unit 7 generates "L" level clock signal $\overline{\phi}_{TO}$ after a delay time $t_{D0}$. This signal $\overline{\phi}_{TO}$ is maintained until the unit 1 is reset by the time out end signal T0E from the unit 6. Since this signal $\overline{\phi}_{TO}$ is fed back to the unit 1 through the OR gate 8, the clock signal $\phi_{IN}$ can be treated as "L" level period $t_{W2}$.

Figure 7:
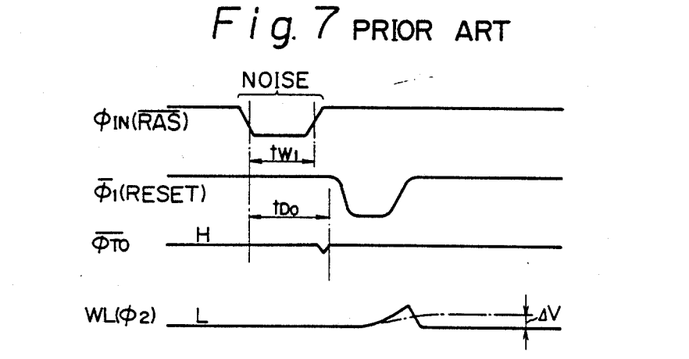

In this case, however, as shown in FIG. 7, when "L" level period $t_{W1}$ is narrower than the period $t_{D0}$, this "L" level period $t_{W1}$ can not be treated as the low level period $t_{W2}$. In this case, the same failures as shown in FIG. 5 occur in the operation of the circuit.

A clock signal generating circuit for a dynamic type semiconductor memory device according to the present invention will be explained in detail hereinafter.

Figure 8:
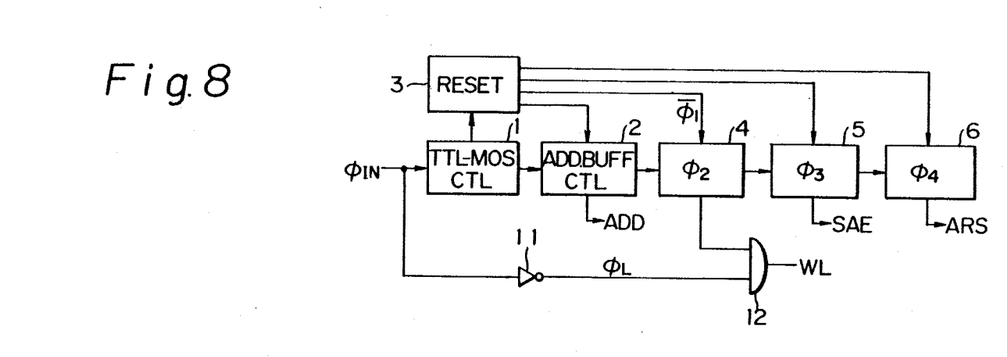
FIG. 8 is a clock signal generating circuit for a dynamic type semiconductor memory device according to an embodiment of the present invention.
Figure 11:
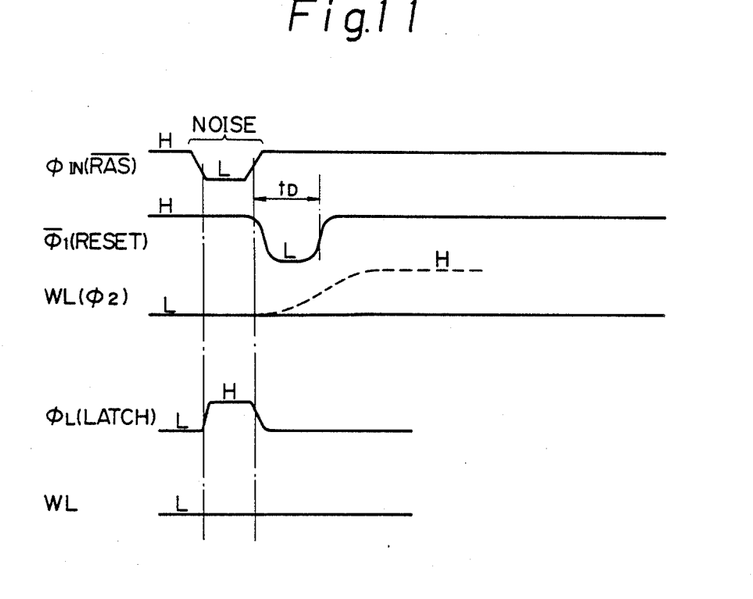
FIG. 11 is a timing chart for explaining a relationship between noise and a latch signal.

Referring to FIG. 8, the same reference numbers are attached to the same components as shown in FIG. 2. In the figure, 11 denotes an inverter and 12 an AND gate. These units 11 and 12 constitute an inhibiting unit for inhibiting a drive of the word line by the second clock signal $\phi_2$ when the address strobe signal $\phi_{IN}$ is high level in the timing of the leading edge of the second clock signal. As is obvious from the drawing, these units 11 and 12 are added to the conventional clock signal generating circuit shown in FIG. 2. The inverter 11 inverts a polarity of the address strobe signal $\phi_{IN}$ and outputs a latch signal $\phi_L$. The latch signal $\phi_L$ is input to one input terminal of the AND gate 12, and the clock signal $\phi_2$ is input to the other input terminal of the AND gate 12. As shown in FIG. 11, when the strobe signal $\phi_{IN}$ ($\overline{RAS}$) becomes "L" level because of noise, the latch signal $\phi_L$ from the inverter 11 becomes "H" level. While, when the $\phi_{IN}$ becomes "L" level, the signal $\phi_2$ changes gradually to "H" level after a delay time $t_D$ shown by a dotted line. In this timing, the signal $\phi_L$ has already returned to the "L" level. Accordingly, the output WL of the AND gate is always maintained at the "L" level. That is, a word line is not always selected and drive of the word line is inhibited regardless of the "L" level of the address strobe signal $\phi_{IN}$.

Figure 12:
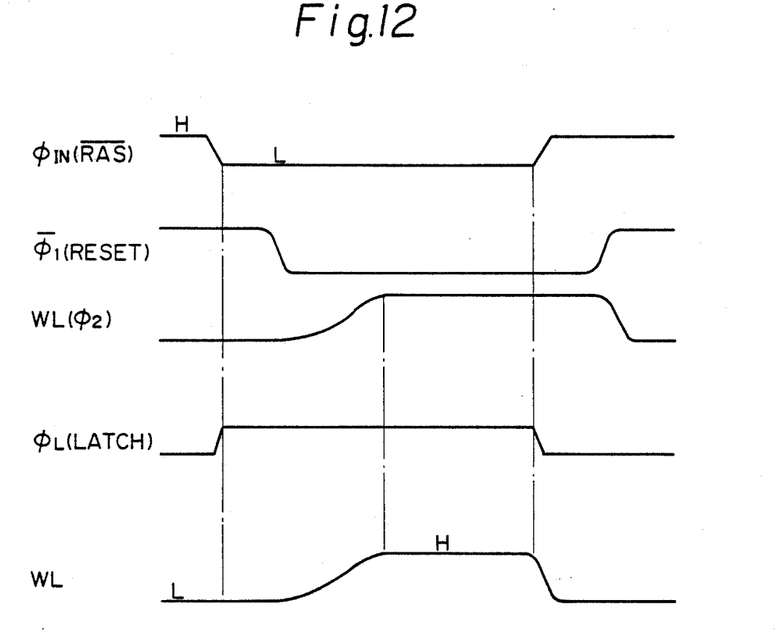
FIG. 12 is a timing chart in the normal state for explaining clock signals in the circuit shown in FIG. 8.

In the normal state, as shown in FIG. 12, when the strobe signal $\phi_{IN}$ is "L" level, the latch signal $\phi_L$ is made "H" level through the inverter 11. Accordingly, when both signals $\phi_2$ and $\phi_L$ are "H" level, the output of the AND gate 12 becomes "H" level, and thus the word line WL is in the selection state.

Figure 9:
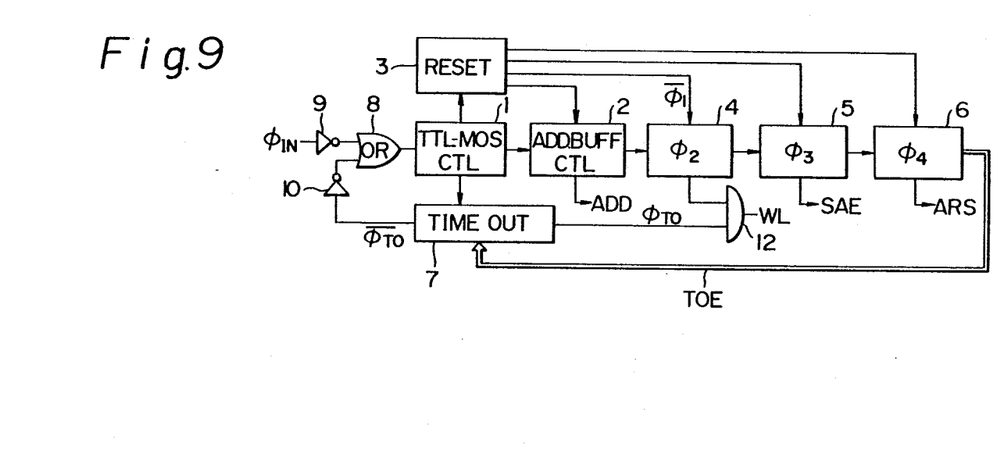
FIG. 9 is a clock signal generating circuit for a dynamic type semiconductor memory device according to another embodiment of the present invention.

Referring to FIG. 9, the same reference numbers are attached to the same components as shown in FIG. 3, and an inhibiting unit is constituted by the time out unit and the AND gate. As is obvious from the drawing, the AND gate is newly added to the conventional clock signal generating circuit shown in FIG. 3. In this case, a signal $\phi_{TO}$ is output from the time out unit 7 as the inverted signal $\overline{\phi}_{TO}$.

Figure 13:
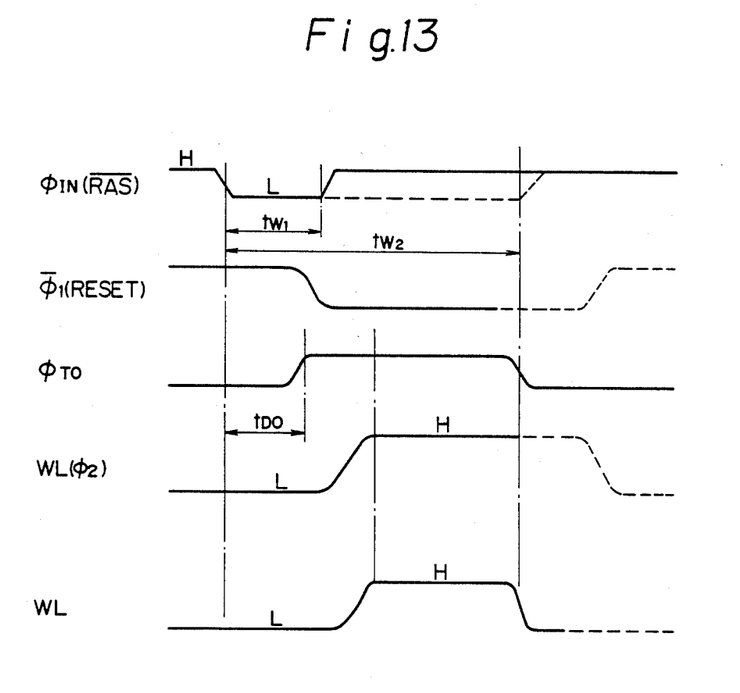
FIG. 13 is a timing chart in the normal state for explaining clock signals in the circuit shown in FIG. 9; and, FIG. 14 is another timing chart for explaining clock signals in the circuit shown in FIG. 9.
Figure 14:
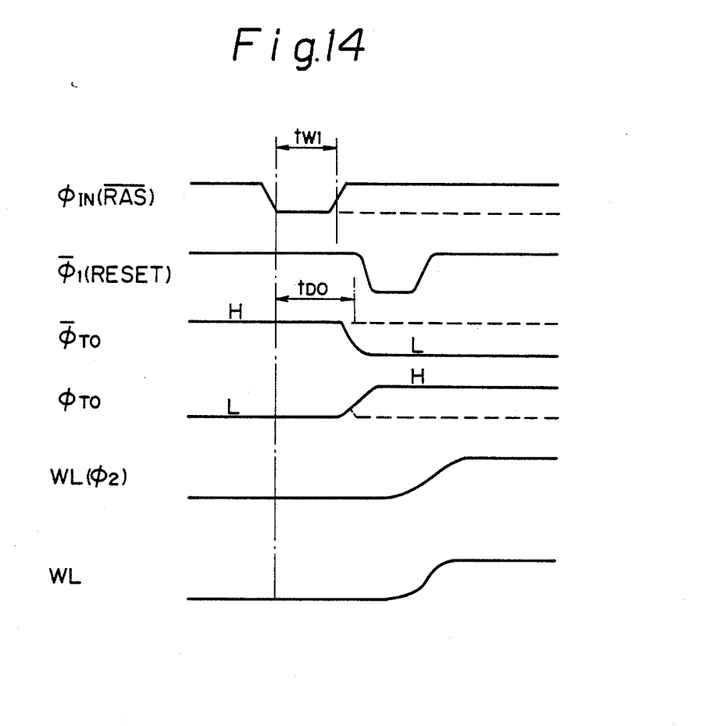

As shown in FIG. 13, when both signals $\phi_{TO}$ and $\phi_2$ are "H" level, the output of the AND gate 12 becomes "H" level. That is, the word line is in the selection state. When the delay period $t_{D0}$ is larger than the period $t_{W1}$, as shown in FIG. 14, since the address strobe signal $\phi_{IN}$ is treated as the low level signal, as shown by a dotted line, the signal $\phi_{TO}$ becomes "L" level and the inverted signal $\phi_{T0}$ becomes "H" level, as shown by a solid line. Accordingly, when both signals $\phi_{T0}$ and $\phi_2$ are "H" level, the output of the AND gate 12 becomes "H" level, and word line is then in the selection state.

Figure 10:
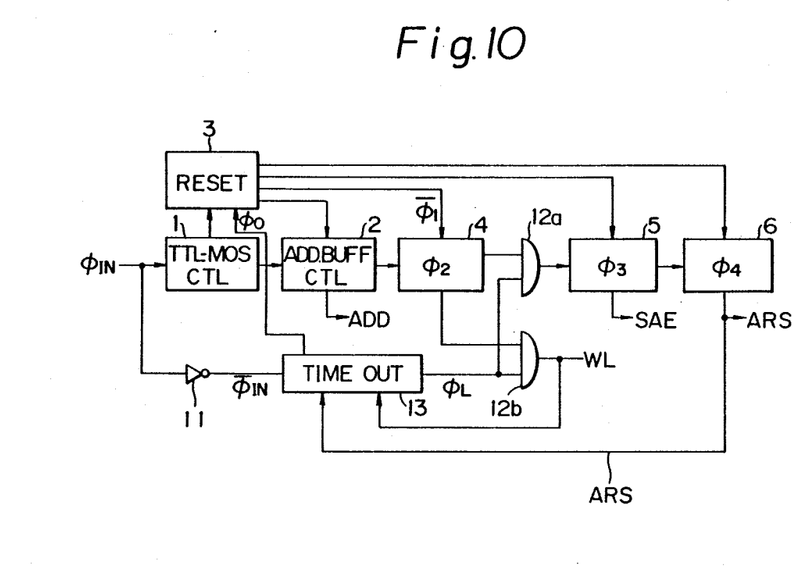
FIG. 10 is a clock signal generating circuit for a dynamic type semiconductor memory device according to still another embodiment of the present invention.

Referring to FIG. 10, reference number 12a denotes the AND gate and 13 the time out unit. The inhibiting unit according to this embodiment constitutes the time out unit 13 for treating the high level of the addres strobe signal as the low level of the address strobe signal during a predetermined period, the AND gate 12b for outputting the word line selection signal WL based on both high levels of the second clock signal $\phi_2$ and the inverted time out signal $\phi_L$, and the inverter 11 for inverting the address strobe signal. The AND gate 12a and the time out unit 13 are added to the circuit shown in FIG. 8. The "active restore" signal ARS is fed back to the time out unit 13 instead of the time out end signal T0E. When the word selection signal WL is output from the AND gate 12b, the signal WL is branched and the branched signal is fed back to the time out unit 13. The signal $\phi_L$ is maintained at the "H" level during a predetermined period by the time out unit 13 even if the signal $\phi_{IN}$ becomes "H" level. In this case, the reset signal $\overline{\phi_1}$ is generated from the reset unit 3 in response to a reset signal $\phi_0$. The reset signal $\phi_0$ is generated after the predetermined period indicating time out. Accordingly, since the word line WL is in the selection state, the memory cell of the word line is completely restored by the "active restore" signal ARS during a predetermined period. The merit of this embodiment lies in that the sensitivity to noise is most suitable for transmission of the address strobe signal. That is, in this embodiment, when the noise width is wide, such a noise can be detected. While, when the noise width is very narrow, such a noise can be ignored. Accordingly, since a suitable sensitivity to noise can be obtained, this embodiment is preferable in actual use.

What is claimed is:

1. A clock signal generating circuit for a dynamic type semiconductor memory device comprising:
    an input voltage level control means for converting a transistor-transistor-logic (TTL) drive level to a metal-oxide-semiconductor (MOS) drive level during transmission of an address strobe signal,
    an address buffer control means for generating an address signal and an inverted address signal in response to a trailing edge of the address strobe signal,
    a clock signal generating means for generating a clock signal used for a word line selection and an input signal for a next stage in response to a low level of the address strobe signal, and
    an inhibiting means for inhibiting a drive of the word line by the clock signal when the address strobe signal is at high level in the timing of a leading edge of the clock signal.

2. A clock signal generating circuit as claimed in claim 1, wherein said inhibition means comprises an inverter for inverting the address strobe signal, and an AND gate for outputting a word line selection signal based on both high levels of the clock signal and the inverted address strobe signal.

3. A clock signal generating circuit as claimed in claim 1, wherein said inhibiting means comprises a time out unit for treating the high level of the address strobe signal as the low level of the address strobe signal during a predetermined period, and an AND gate for outputting the word line selection signal based on high levels of both the clock signal and inverted time out signal.

4. A clock signal generating circuit as claimed in claim 1, wherein said inhibiting means comprises a time out unit for treating the high level of the address strobe signal as the low level of the address strobe signal during a predetermined period, an AND gate for outputting the word line selection signal based on high levels of both the clock signal and the inverted time out signal, and an inverter for inverting the address strobe signal.

5. A clock signal generating circuit as claimed in claim 4, wherein said word line selection signal from the AND gate is fed back to the time out circuit.

6. A clock signal generating circuit as claimed in claim 1, wherein said active restore signal is fed back to the inhibiting means.

* * * * *